United States Patent [19]
Westra

[11] 3,990,008
[45] Nov. 2, 1976

[54] DISPLAY CIRCUIT FOR BATTERY POWERED DIGITAL METER

[75] Inventor: Marlin D. Westra, Sioux Falls, S. Dak.

[73] Assignee: Sencore, Inc., Sioux Falls, S. Dak.

[22] Filed: Mar. 12, 1975

[21] Appl. No.: 557,893

[52] U.S. Cl. .............................. 324/120; 324/99 D; 340/347 AD
[51] Int. Cl.² .................. G01R 19/26; H03K 13/20
[58] Field of Search ............. 324/99 D, 103 P, 111, 324/120; 340/347 AD

[56] References Cited
UNITED STATES PATENTS

| 3,316,547 | 4/1967 | Ammann | 324/99 D |
| 3,896,375 | 7/1975 | Trolliet | 324/103 P |

*Primary Examiner*—R. V. Rolinec
*Assistant Examiner*—Ernest F. Karlsen
*Attorney, Agent, or Firm*—Edmond T. Patnaude

[57] ABSTRACT

A digital meter incorporates a circuit which senses the input voltage and automatically energizes a digital readout device only if the input voltage is greater than a predetermined absolute value.

3 Claims, 3 Drawing Figures

DISPLAY CIRCUIT FOR BATTERY POWERED DIGITAL METER

The present invention generally relates to electric meters having a digital display, and it relates more particularly to a new and improved display control circuit which automatically disables the display unless the value being metered exceeds a predetermined value.

BACKGROUND OF THE INVENTION

Most present day digital meters employ visual displays such as gas-discharge devices or light-emitting diodes which draw a considerable amount of power when energized. Accordingly, when designed for portable field use such meters have employed relatively large, rechargeable batteries. While liquid crystal displays operate at lower power and can thus be powered by small batteries, they do not function at extreme temperatures, and moreover, they are difficult to read.

Digital meters of the portable type thus employ rather costly rechargeable batteries making the manufacturing cost high and requiring frequent recharging of the batteries. It would, therefore, be desirable to provide a portable digital meter suitable for field use and employing non-rechargeable batteries.

SUMMARY OF THE INVENTION

Briefly, there is provided in accordance with the teachings of the present invention a novel circuit which automatically energizes a visual display only when a measurement is being made, at other times the display remains deenergized thereby conserving battery power. The metering circuit includes an integrator which develops a ramp wave of predetermined slope which is compared with the input signal being measured. When the voltage of the ramp wave reaches that of the input signal the output of a digital counter is gated to the display means. The automatic display control circuit of the present invention incorporates a time delay means which enables the display at a predetermined time after initiation of the ramp wave if at that time the ramp wave voltage is less than that of the input. Consequently, even though the meter itself is energized the display does not draw any power from the battery except when a measurement is actually being made.

BRIEF DESCRIPTION OF THE DRAWING

Further objects and advantages and a better understanding of the present invention can be had by reference to the following detailed description, wherein.

DETAILED DESCRIPTION OF THE INVENTION

Figure 1:
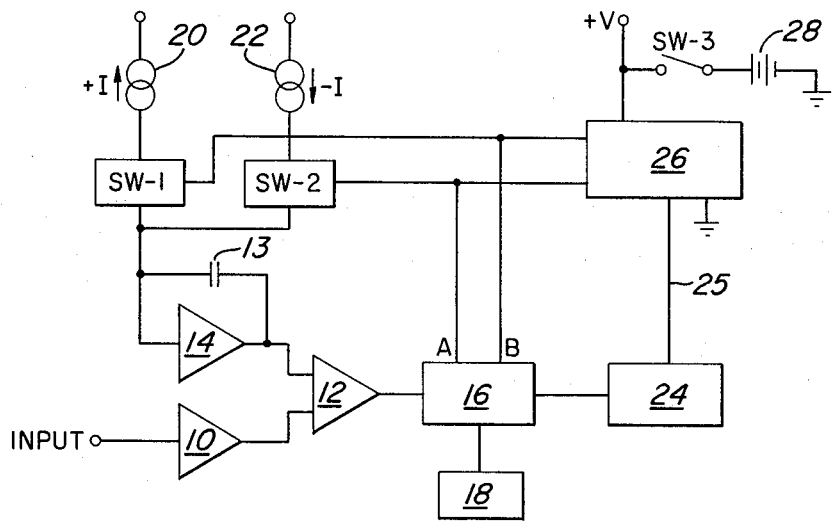
FIG. 1 is a block diagram of a digital display meter circuit embodying the present invention.

Referring to FIG. 1, the voltage to be measured is supplied to a buffer amplifier 10, and the amplified output voltage is applied to one input of a comparator 12. The other input of the comparator 12 is connected to the output of an integrating capacitor 13 having a constant slope ramp output wave form because of a buffer amplifier 14 connected in parallel therewith. A digital counter 16 is supplied with clock pulses from a pulse generating clock circuit 18 which resets after a given predetermined number of clock pulses. In a preferred embodiment of this invention the counter 16 resets on the two-thousandth pulse. Each time the counter 16 resets and passes through the zero count the voltage on one or the other of a pair of output terminals A and B goes high to close a respective one of a pair of switches SW-1 and SW-2 to supply current to the integrator 14 from one of a pair of Zener diode regulated voltage sources 20 and 22 and thus initiate the ramp wave form.

The output voltage from the integrator 13, 14 thus increases at a constant rate until it equals that of the amplified input voltage supplied to the comparator 12. When the two input voltages to the comparator 12 become equal the output thereof changes state or toggles. This causes the control logic in the digital counter 16 to reset the integrator by returning the HI terminal A or B to the LO state and to supply the accumulated pulse count to a visual display device 24 which, if energized or enabled, displays the number of clock pulses counted during the measuring cycle. Since the ramp wave form has a constant slope, the number of counted pulses is directly proportional to the value of the input voltage and the display is calibrated accordingly.

The display 24 is disabled at all times except when an enabling voltage is supplied thereto via a conductor 25 from an automatic display enabling circuit 26. As more fully explained hereinafter, the circuit 26 senses the presence of a logic HI voltage at either of the digital counter outputs A and B a short time after initiation of each measuring cycle, and in the absence thereof does not provide the enabling voltage. Since the output of the comparator 12 changes state almost immediately after initiation of each measuring cycle when no input voltage is present, the display 24 remains de-energized until a voltage to be measured appears at the input. It will be understood that the other circuits include only low power consumption elements which remain energized when the meter is turned on so that the meter is in a standby condition ready for a measurement whenever a voltage is applied to the buffer amplifier 10.

Figure 2:
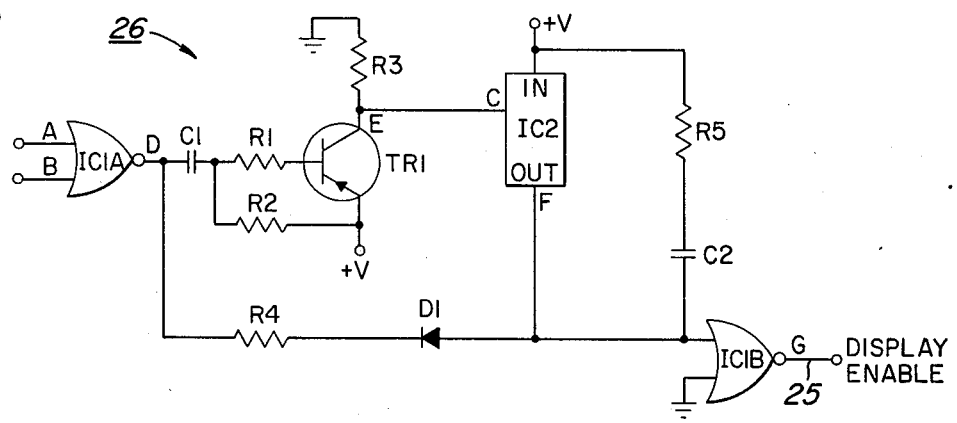
FIG. 2 is a schematic circuit diagram of the automatic display enabling circuit used in the meter circuit of FIG. 1.

Referring to FIG. 2, the automatic display enabling circuit 26 may be seen to include a NOR gate IC1A to which the digital counter outputs A and B are connected. The output A is provided with a HI voltage for positive voltage inputs and the output B is provided with HI voltage for negative voltage inputs. The output of the NOR gate IC1A appearing at terminal D is an inverted signal which is coupled between the base and emitter of a transistor TR1 by means of an RC timing circuit comprising a capacitor C1 and a pair of resistors R1 and R2. The signal at the collector terminal E of the transistor TR1 goes to a logic HI and remains there for about four counts (four input impulses). When the voltage at E is HI it closes the switch IC2 which raises the terminal F to the V+ potential applied to the input terminal of the switch and permits a capacitor C2 to discharge through a resistor R5. When, after about four counts, transistor output E changes back to the LO state and opens switch IC2, the capacitor C2 again charges through resistor R5, a diode D1 and a resistor R4 if, and only if, point D is in the LO state evidencing the presence of a HI voltage at either terminal A or terminal B. If capacitor C2 charges long enough for the input to a NOR gate IC1B to reach the transition level, both inputs thereto will be low and a HI level voltage will appear at the output G. This is the enabling voltage which energizes the display 24 from the meter battery. If the HI voltage at terminal A or B does not continue for the required time of about ten counts, the voltage level at D will go HI before the input to the NOR gate IC1B goes below the transition point and the display 24 will remain disabled.

Figure 3:
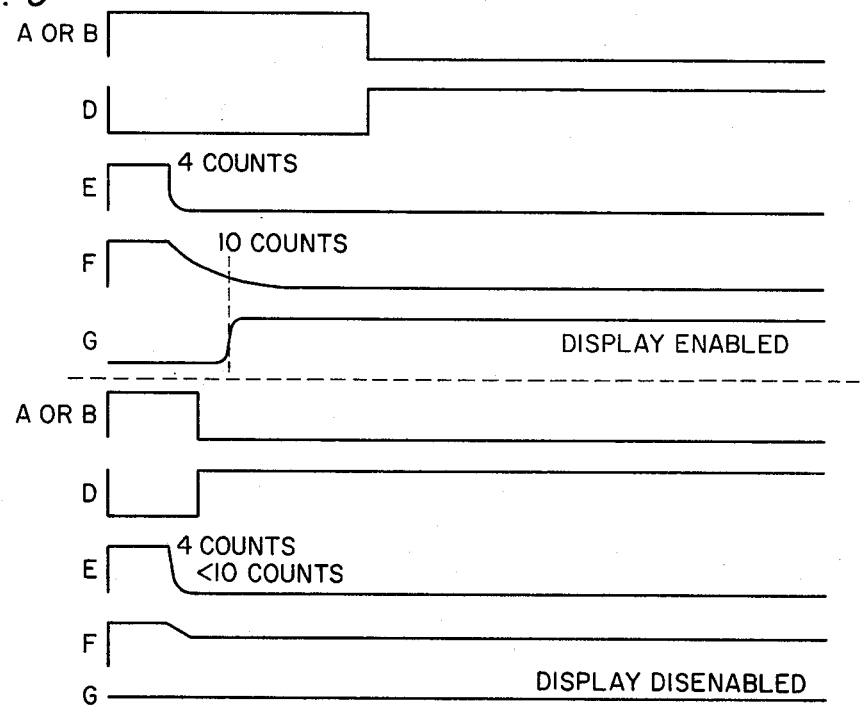
FIG. 3 is an illustration of several wave forms appearing at different locations in the circuit of FIG. 2 and which are referred to hereinafter in explaining the operation thereof.

Referring now to FIG. 3, the upper five wave forms illustrate the voltage levels at points A through G in FIG. 3 when a measurable voltage is present at the meter input. The lower five wave forms illustrate the voltage levels at points A through G in FIG. 2 when the voltage present at the meter input is too low to measure. If, for example, the input voltage were zero, the wave form of the switching voltage A or B would be a positive spike and the wave form at point D would be a negative spike. The wave forms at points E and F would, as shown, remain the same and the voltage at point G would remain low.

OPERATION

When the meter is energized by closing the on-off switch SW-3, all of the low power, solid state circuits are energized from a six volt battery 28 wherefor the system clock 18 operates to provide timing pulses at the 10 KHz rate. The output of the comparator 12 will be at either the logic LO or HI level so that when the counter resets after 1999 counts either point A or point B will go HI and remain at that level until the comparator 12 toggles. The capacitor 13 then begins to charge through whichever switch SW-1 or SW-2 is open causing the comparator 12 to toggle, thereby returning the HI voltage at A or B to the Lo level. If the comparator toggles in less than ten counts, the display is held in the disabled or de-energized condition by the automatic display control circuit 26 in the manner described above.

If the input voltage is such that the ramp voltage applied to the comparator 12 has not reached the level of the output of amplifier 10 in less than ten counts, then the display 24 is energized through the automatic enabling circuit 26 from the battery 28. When the ramp voltage reaches the amplified input level the comparator 12 then toggles and the number of pulses counted by the digital counter 16 is displayed.

While the present invention has been described in connection with a particular embodiment thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed is:

1. A meter for measuring the level of an electric signal and providing a digital display representative thereof, comprising
    a ramp voltage generator providing a ramp wave output,
    comparator means to which said electric signal and said ramp wave output are applied for providing an output signal when the two inputs thereto are in a predetermined proportion,
    control means responsive to the output of said comparator means for providing a switching signal to interrupt the generation of said ramp wave,
    a clock pulse generator,
    a pulse counter to which the pulses from said generator are applied,
    said counter resetting after every predetermined number of counts and initiating a metering cycle,
    a digital display device for providing a visual readout of said level,
    means responsive to said level at said input for coupling the count in said pulse counter to said display device when the number of pulses counted is representative of said level, and
    automatic control means responsive to said level for energizing said display device only when the amplitude of said signal is above a predetermined level, said automatic control means also being responsive to said switching signal and including time delay means for sensing the presence of said switching signal at a predetermined time after initiation of each metering cycle.

2. A meter according to claim 1 wherein said automatic control means further comprises
    an RC circuit including a capacitor and a resistor,
    means for discharging said capacitor in response to the initial occurrence of said switching signal,
    said time delay means maintaining said capacitor discharged for a short predetermined time interval,
    charging means for charging said capacitor after said short predetermined time interval only after termination of said switching signal, and
    means responsive to the voltage across said capacitor for energizing said digital display device only when the voltage across said capacitor is below a predetermined value.

3. A meter according to claim 2 wherein said last named means is a solid state NOR circuit.

* * * * *